US010141261B2

(12) United States Patent
Khalid

(10) Patent No.: US 10,141,261 B2
(45) Date of Patent: Nov. 27, 2018

(54) DEVICE COMPRISING NANOSTRUCTURES AND METHOD OF MANUFACTURING THEREOF

(76) Inventor: Waqas Khalid, Berkeley, CA (US)

( * ) Notice: Subject to any disclaimer, the term of this patent is extended or adjusted under 35 U.S.C. 154(b) by 0 days.

(21) Appl. No.: 14/129,373

(22) PCT Filed: Jun. 29, 2012

(86) PCT No.: PCT/EP2012/062744
§ 371 (c)(1),
(2), (4) Date: Mar. 28, 2014

(87) PCT Pub. No.: WO2013/001076
PCT Pub. Date: Jan. 3, 2013

(65) Prior Publication Data
US 2014/0217473 A1    Aug. 7, 2014

Related U.S. Application Data

(60) Provisional application No. 61/502,341, filed on Jun. 29, 2011.

(30) Foreign Application Priority Data

Jun. 29, 2011    (EP) .................................... 11171883

(51) Int. Cl.
*H01L 23/525*    (2006.01)
*H01L 23/532*    (2006.01)
(Continued)

(52) U.S. Cl.
CPC ...... *H01L 23/53276* (2013.01); *H01J 1/3044* (2013.01); *H01J 9/025* (2013.01);
(Continued)

(58) Field of Classification Search
CPC .............................................. H01L 23/53276
See application file for complete search history.

(56) References Cited

U.S. PATENT DOCUMENTS 5,581,091 A * 12/1996 Moskovits ............. B82Y 10/00
205/153
6,278,231 B1 * 8/2001 Iwasaki ............... B81C 1/00087
313/310
(Continued)

FOREIGN PATENT DOCUMENTS

WO    WO 2006/120789 A1    11/2006
WO    WO 2010/037097 A1    4/2010

OTHER PUBLICATIONS

International Search Report (PCT/ISA/210) dated Aug. 24, 2012 by the European Patent Office as the International Searching Authority for International Application No. PCT/EP2012/062744.
(Continued)

*Primary Examiner* — Eugene Lee
(74) *Attorney, Agent, or Firm* — McCarter & English, LLP; Jonathan M. Sparks

(57) ABSTRACT

A method for manufacturing of a device including a first substrate including a plurality of sets of nanostructures arranged on the first substrate, wherein each of the sets of nanostructures is individually electrically addressable, the method including the steps of: providing a substrate having a first face, the substrate having an insulating layer including an insulating material arranged on the first face of the substrate forming an interface between the insulating layer and the substrate; providing a plurality of stacks on the first substrate, wherein each stack includes a first conductive layer and a second conductive layer; heating the first substrate having the plurality of stacks arranged thereon in a reducing atmosphere to enable formation of nanostructures on the second conductive material; heating the first substrate having the plurality of stacks arranged thereon in an atmosphere such that nanostructures are formed on the second layer.

16 Claims, 3 Drawing Sheets

(51) Int. Cl.
*H01J 1/304* (2006.01)
*H01J 9/02* (2006.01)
*H01L 21/768* (2006.01)

(52) U.S. Cl.
CPC ...... *H01L 21/76886* (2013.01); *H01L 23/525* (2013.01); *H01L 2924/0002* (2013.01)

(56) References Cited

U.S. PATENT DOCUMENTS

| | | | |
|---|---|---|---|
| 6,900,580 B2 | 5/2005 | Dai et al. | |
| 2002/0163079 A1* | 11/2002 | Awano | B82Y 10/00 257/750 |
| 2004/0152240 A1* | 8/2004 | Dangelo | B82Y 10/00 438/122 |
| 2004/0219773 A1* | 11/2004 | Choi | B82Y 10/00 438/597 |
| 2006/0091557 A1* | 5/2006 | Sakamoto | B82Y 10/00 257/774 |
| 2006/0138394 A1 | 6/2006 | Den et al. | |
| 2007/0001220 A1* | 1/2007 | Tombler, Jr. | B82Y 10/00 257/330 |
| 2007/0148963 A1* | 6/2007 | Chan | H01L 21/76879 438/637 |
| 2008/0224115 A1* | 9/2008 | Bakkers | B82Y 10/00 257/1 |
| 2008/0241755 A1* | 10/2008 | Franklin | B82Y 10/00 430/296 |
| 2009/0233124 A1 | 9/2009 | Berg et al. | |
| 2009/0272565 A1* | 11/2009 | Gosset | B82Y 10/00 174/257 |
| 2011/0073827 A1* | 3/2011 | Rubloff | B82Y 10/00 257/3 |
| 2011/0101528 A1* | 5/2011 | Akimoto | H01L 21/76802 257/751 |

OTHER PUBLICATIONS

Waqas Khalid et al., "High-Aspect-Ratio, Free-Form Patterning of Carbon Nanotube Forests Using Micro-Electro-Discharge Machining", Diamond and Related Materials, vol. 19, No. 11, Nov. 1, 2010, pp. 1405-1410, XP-027358371.

Suguru Noda et al., "Millimeter-Thick Single-Walled Carbon Nanotube Forests Hidden Role of Catalyst Support", Japanese Journal of Applied Phiysics, vol. 46, No. 17, Jan. 1, 2007, pp. L399-L1401, XP-055009661.

Sigen Wang et al., "A Carbon Nanotube Field Emission Multipixwl X-Ray Array Source for Microradiotherapy Application", Applied Physics Letters, vol, 98, No. 21, May 25, 2011, pp. 21370-1 to 213701-3, XP-012140834.

* cited by examiner

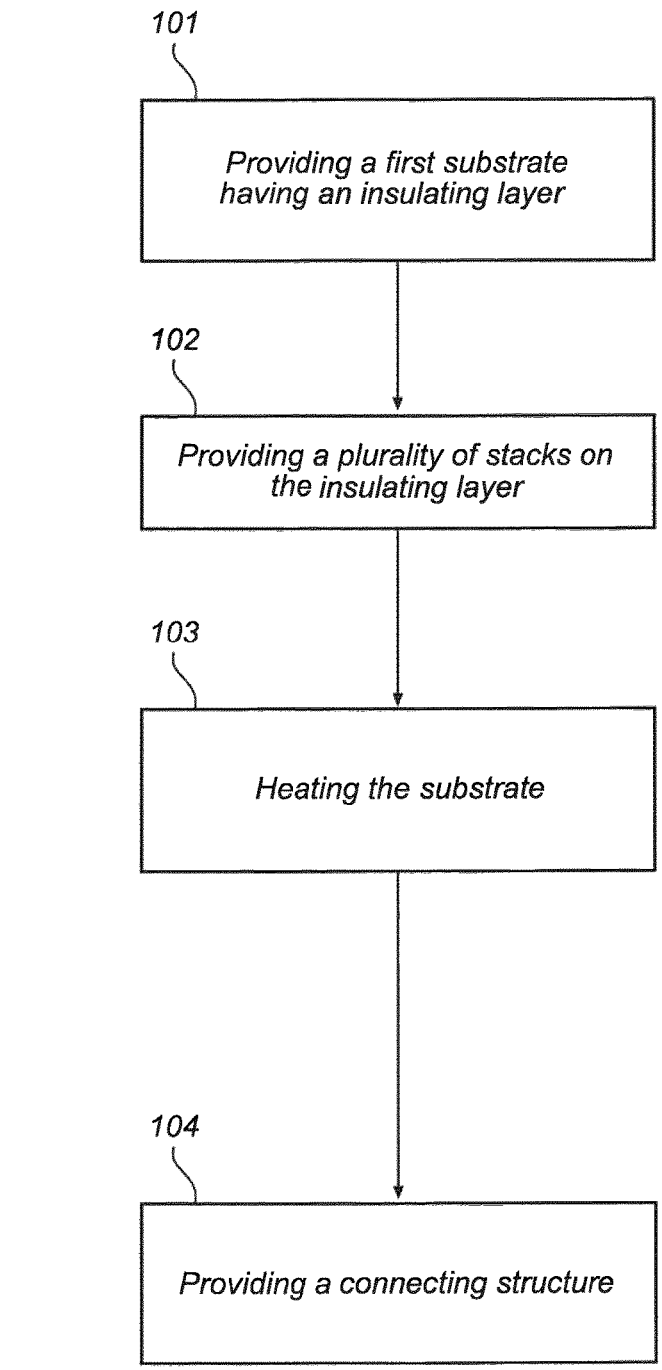
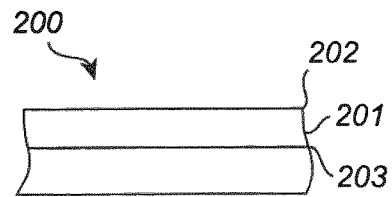
Fig. 2a
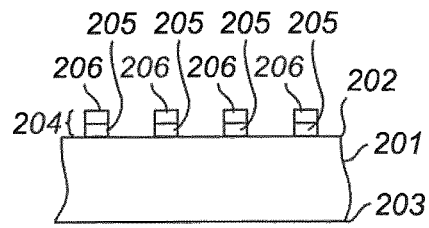
Fig. 2b
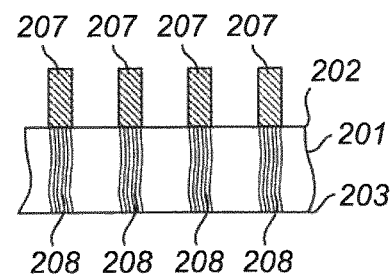
Fig. 2c
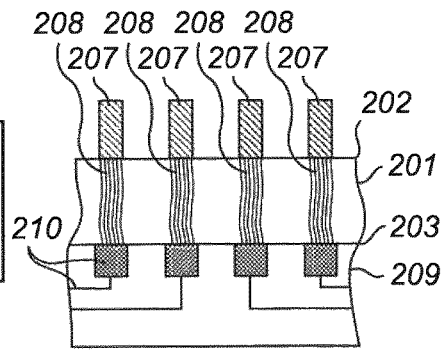
Fig. 2d
Fig. 1

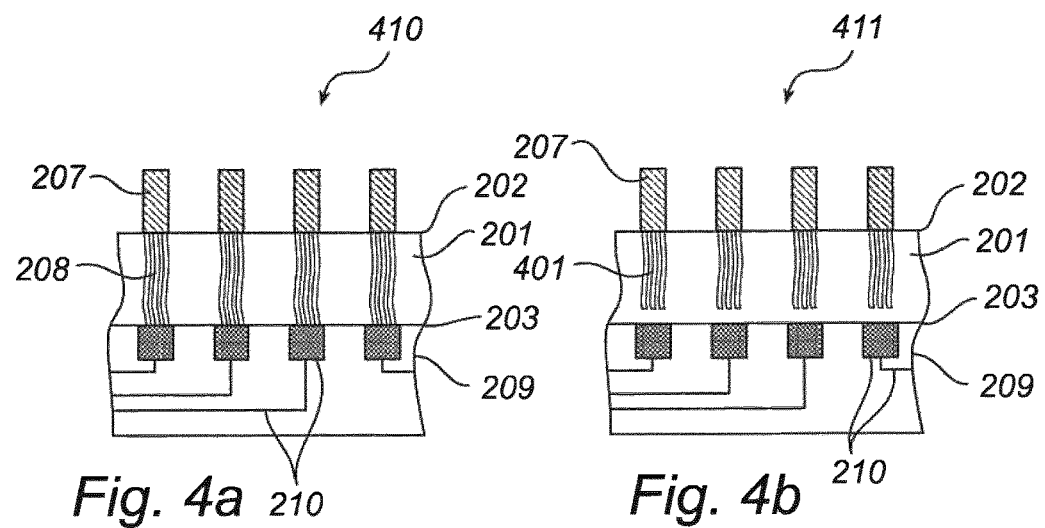
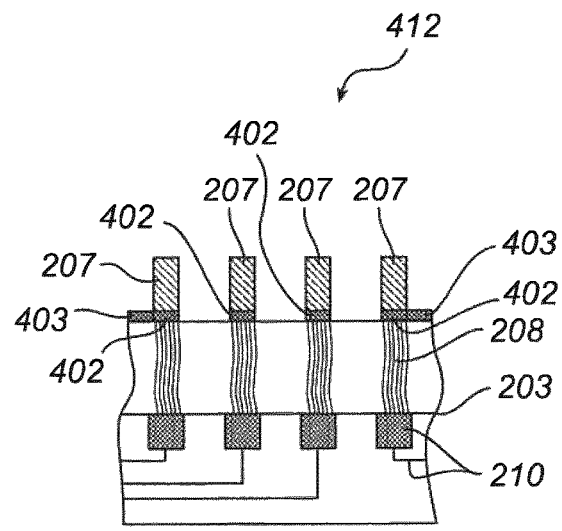

ns of the

DEVICE COMPRISING NANOSTRUCTURES AND METHOD OF MANUFACTURING THEREOF

FIELD OF THE INVENTION

The present invention relates to an electrical device comprising individually addressable bundles of nanostructures and method for manufacturing thereof.

BACKGROUND OF THE INVENTION

Carbon nanotubes (CNTs) consist of graphene sheets of carbon atoms which are rolled up into a cylinder having a diameter in the range of nanometers and a length which may range from nanometer to centimeters. CNTs may be so-called single-walled nanotubes (SWNT) having a structure of a uniform cylinder of a single graphene sheet. Alternatively, CNTs may be so-called multi-walled nanotubes (MWNT) consisting of a plurality of SWNTs with different diameter and thus arranged within each other, or a single graphene sheet which is rolled up around itself several times giving multiple layers.

Several methods for the production of CNTs are known, including, for example, arc discharge, laser ablation, and chemical vapor deposition (CVD), wherein the latter is the most common for commercial production of CNTs and typically involves preparing a substrate with a metal catalyst, such as, iron, cobalt or nickel and subsequently heating the substrate in an atmosphere comprising a process gas such as ammonia, nitrogen or hydrogen, and a gas comprising a carbon source, such as for example acetylene, ethylene, or alcohols. Thus, giving growth of CNTs at the surface of the metal catalyst. The orientation of the CNTs on the metal catalyst may be controlled by adapting the reaction conditions such that vertically aligned CNTs are produced, i.e. CNTs extending perpendicularly to the surface of the metal catalyst.

Given that CNTs have high mechanical strength as well as high thermal and electrical conductivity, many potential applications for CNTs have been proposed, including, for example, sensors, hydrogen storage media, probes, semi-conductor device, field emission device, and conductive and high-strength composites, among others.

A problem associated with present conventional manufacturing methods for CNTs is that it is difficult to control both the growth of CNTs in predefined orientations and configurations at specific location on a substrate and the interface with other materials such as metal electrodes.

U.S. Pat. No. 6,900,580 B2 discloses a field emission device and the manufacturing of such device, wherein the device has bundles of aligned parallel CNTs on a substrate, the bundles extending only from regions of the substrate patterned with a catalyst material, thus providing accurate control of size, shape, and distribution of the bundles on the substrate surface, and furthermore, each bundle can thereby be individually controlled by connecting patterned metallization lines to the bundles.

However, the method for manufacturing of CNTs according to U.S. Pat. No. 6,900,580 B2 is tedious and presumably not very cost effective.

Hence, there is a need in the art to facilitate the manufacturing of CNTs for use in electrical devices.

SUMMARY OF THE INVENTION

In view of the above-mentioned and other drawbacks of the prior art, a general object of the present invention is to provide an improved method for manufacturing of a device comprising nanostructures, in particular having individually electrically addressable sets of nanostructures.

According to the present invention there is provided a method for manufacturing of a device comprising a first substrate comprising a plurality of sets of nanostructures arranged on said first substrate, wherein each of said sets of nanostructures is individually electrically addressable, said method comprising the steps of: providing a substrate having a first face, said substrate having an insulating layer comprising an insulating material arranged on said first face of said substrate forming an interface between said insulating layer and said substrate; providing a plurality of stacks on said first substrate, said stacks being spaced apart from each other, wherein each stack comprises a first conductive layer comprising a first conductive material and a second conductive layer comprising a second conductive material different from said first material, said second conductive layer being arranged on said first conductive layer for catalyzing nanostructure growth; heating said first substrate having said plurality of stacks arranged thereon in a reducing atmosphere to enable formation of nanostructures on said second conductive material; heating said first substrate having said plurality of stacks arranged thereon in an atmosphere such that nanostructures are formed on said second layer; wherein said insulating material and said first conductive material are selected such that during said heating steps, said first conductive material interacts with said insulating material to form an electrically conductive portion within said insulating layer below each of said stacks, wherein said electrically conductive portion comprises a mixture of said first conductive material and said insulating material and/or reaction adducts thereof.

The present invention is based on the realization that sets of nanostructures may be grown on a substrate having an insulating layer comprising an insulating material whilst during the same heating cycle forming an electrically conductive portion within the insulating layer electrically connecting each individual set of nanostructures, by providing stacks on the insulating layer of at least a first and a second layer comprising a first and a second material, respectively, wherein the second layer is arranged on the first layer which in turn is in arranged on the insulating layer. The second material is chosen to catalyze the growth of nanostructures at elevated temperatures, while the first material and the insulating material are chosen such that the first material is conductive and may, upon heating, mix or diffuse and/or react with the insulating material resulting in an electrically conductive and/or semi-conductive mixture. Thus by heating the substrate having such stacks arranged thereon, a plurality of sets of nanostructures may be produced wherein the portions of the insulating layer underlying the sets of nanostructures comprise a conductive and/or semi-conductive material. Thereby each set of nanostructures may be individually electrically connectable.

The term "nanostructure" should, in the present context, be understood as any structure having a diameter or width in the range of nanometers. Examples of such nanostructure includes, but not limited to, carbon nanotubes, nanowires and nanorods of various materials such as for example ZnO, and carbon nano fibers.

The term "set of nanostructures" should in the context of the present invention, be understood as a plurality of nanostructures arranged in close proximity (for example from micrometer to sub-micrometer) to each other on a portion of the substrate, which portion is separated from other portions of the substrate comprising nanostructures, and which portion comprises an electrically conductive portion underlying the set of nanostructures. A set of nano structures may comprise nanostructures arranged in bundles. A set of nanostructure may correspond to a portion of the substrate having a length and width in the range from nanometers to micrometers. Furthermore, when a set of nanostructures is being individually addressed, all nanostructures comprised in such set are typically addressed.

In embodiments of the invention, the first material may be electrically conductive or semi-conductive. Thereby, a conductive or semi-conductive electrically conductive portion may be achieved through diffusion of the first material into the first substrate.

In embodiments of the invention, the first material of the first layer and the insulating material of the insulating layer may be chosen such that a conductive or semi-conductive material can be achieved through a chemical reaction there between.

Heating the substrate having the stacks arranged on the insulating layer thereof may cause the first material of the first stack layer to diffuse or mix with the underlying portion of the insulating material of the first substrate, and as a result, these portions may be made electrically conductive or semi-conductive depending on the electrical properties of the first material. In addition, or alternatively, heating the substrate having a first material arranged on the insulating layer thereof may cause the first material to react with the underlying portion of the insulating material of the first substrate giving reaction product(s) which may be electrically conductive and/or semi-conductive, in which case the first material does not necessarily need to be electrically conductive or semi-conductive in order to achieve the electrically conductive or semi-conductive portions.

In embodiments of the invention, the first material and insulating material are chosen such that a diffusion of the first material into the first substrate and/or a reaction between the first material and the insulating material may be achievable by heating the first substrate having the stacks arranged thereon to within a preferred temperature interval of from 100° C. to 1000° C.

According to one embodiment of the invention, the temperature interval is preferably between 500° C. and 1000° C., more preferably between 700° C. and 900° C., and most preferably between 750° C. and 800° C.

In embodiments of the invention the thermal reaction between the first material and the insulating material may be a reduction-oxidation reaction wherein, for example, the first material is oxidized and the insulating material is reduced. Thus, the resulting reaction mixture may comprise oxidized and non-oxidized first material, and reduced and non-reduced insulating material.

In embodiments of the invention the first material may comprise a metal and/or an oxide or nitride thereof. For example, the first material may be aluminum.

In embodiments of the invention the insulating material may be an oxide of a metalloid (or semimetal) such as, for example, silicon dioxide.

The electrical properties of the electrically conductive portions may be controlled through the choice of the first material and/or the insulating material. Thus, the first material may advantageously be selected with respect to the insulating material, and vice versa, such that an electrically conductive and/or semi-conductive mixture is achieved upon heating thereof.

In an exemplary embodiment, the first material may be aluminum (Al) and the insulating material may be silicon dioxide ($SiO_2$), in which case the corresponding reaction mixture there between would comprise Al, $Al_xO_y$, $SiO_2$, $Al_x(SiO_2)_y$, and Si, giving a reaction mixture having both conductive (i.e. Al) and semi-conductive (i.e. Si) electrical properties. Similarly, gold (Au) may also be used to form an electrically conductive portion within the insulating material.

Further, the heating temperature and/or incubation time may, of course, also be varied in order to achieve a desirable electrical property of the electrically conductive portions. For example, by varying the temperature, the rate of the reaction and/or diffusion may be controlled, and by varying the reaction time, the extent of the reaction and/or diffusion may be controlled.

The depth of each electrically conductive portion within the first substrate relates to the depth of penetration of the first material into the insulating layer due to diffusion or mixing of the first material into the insulating layer and/or reaction of the first material with the insulating material of the insulating layer, and can thus be controlled by, for example, adapting the thickness of the first layer comprising the first material and/or the thickness of the insulating layer, adapting the temperature at which the substrate is heated, or adapting the time of heating.

Thereby, the extension and structure of the electrically conductive portions may be controlled to fit with a given desirable application.

In embodiments of the invention, the electrically conductive portion may be a path formed through the insulating layer, thereby forming an electrical connection junction at the interface between the insulating layer and the underlying substrate such that each of the sets of nanostructures is electrically connectable via each of the electrical connection junctions.

Alternatively, in embodiments of the invention, the structure of the electrically conductive portions may be controlled such that the depth thereof within the first substrate is such that the electrically conductive portions do not penetrate through the insulating layer and thus each electrically conductive portion is isolated from the substrate and thereby an electrical connection junction, corresponding to a capacitive and/or inductive electrical connection, to each electrically conductive portions may be achieved.

The second material of the second layer catalyzing the growth of nanostructures thereon, may advantageously be electrically conductive or semi-conductive. Examples of such catalytic materials include, but is not limited to, Fe, Co and Ni.

In embodiments of the present invention, the stacks may comprise an intermediate layer arranged in between the second and first layer, wherein the intermediate layer may comprise an electrically conductive and/or semi-conductive material, and wherein each intermediate layer may be electrically connectable to a power source, through for example a connecting structure on top of the first face of the substrate, thereby providing a second individually addressable electrical connection to each set of nanostructures.

For example, the electrically conductive and/or semi-conductive material of the intermediate layer may, for example, comprise molybdenum and/or titanium, or separate layers of molybdenum and/or titanium, or any other suitable metal, metalloid, or oxides thereof, or alloys of for example Pt, Ti, Au, Mo, Pd and W.

In embodiments of the present invention, the method may further comprise the step of providing a connecting structure underlying the insulating layer configured to provide a first electrical connection to each of the sets of nano structures via a respective one of the electrically conductive portions, which electrically conductive portions are formed through the method of the invention. The connecting structure may be connectable to a power source or a sensing device, and thereby enabling electrical connection of the electrically conductive portions of the insulating layer to a power source or a sensing device.

In embodiments of the present invention, the connecting structure may be provided by a step of providing a second substrate comprising the connecting structure. The connecting structures may for example comprise a plurality of wells comprising a conductive and/or semi-conductive material.

It should be noted that the second substrate may be provided prior to the above described heating step.

According to a second aspect of the present invention, the above-mentioned and other objects are achieved through A having individually addressable sets of nanostructures comprising: a substrate having a first face and an insulating layer comprising an insulating material arranged on the first face of the substrate; a plurality of electrically conductive portions formed by a reaction between the insulating material and a conductive material within the insulating layer, the portions being spaced apart from each other; a set of nanostructures arranged on each of the electrically conductive portions such that each electrically conductive portion is in electrical connection with a respective one of the sets of nanostructures; a connecting structure underlying the insulating layer, the connecting structure being connectable to a power source or a sensing device and configured to provide a first electrical connection to each of the electrically conductive portions, and thereby enabling individual addressing of each set of nanostructures.

The power source may, for example, be a conventional AC or DC power source, a battery, a capacitor system, and the sensing device may, for example, be a multimeter or equivalents, depending on the desired application of the device.

In embodiments of the invention, the device may comprise a second substrate underlying the first substrate, and wherein the second substrate comprises the above-described connecting structure.

In embodiments of the invention, the connecting structure may comprise a plurality of wells each comprising a conductive and/or semi-conductive material and being electrically connectable to a power source, wherein each well provides the first electrical connection to each of the electrically conductive portions.

In embodiments of the invention, the electrically conductive portions may be paths extending through the insulating layer, thereby the electrical connection may be a direct electrical connection between the electrically conductive portions and the connecting structure.

In embodiments of the invention, the electrically conductive portions may extend into the insulating layer to a desirable depth such that the electrically conductive portion is separated from the substrate, thereby the electrical connection between the connecting structure of the second substrate and each of the electrically conductive portions correspond to a capacitive or inductive electrical connection.

Given the individual addressability of the sets of nanostructures as described above, many applications of the device according the invention are possible, for example, sensors, electrostatic actuators, solar cells, heat sinks, nano antennas, electron emitters due to field emission, super capacitors, electron emitting devices, high frequency actuators, diffractive optics, and pinch-wave tweezers, among others.

In embodiments of the invention, the device may comprise an electrically conductive and/or semi-conductive layer in between the sets of nanostructures and the electrically conductive portions, thus providing a second individually addressable electrical connection to each set of nanostructures.

Having a first and a second individually addressable electrical connection may be advantageous for applications such as, for example, programmable arrays of e beam lithography tools, or tunable transmitters or programmable adaptive optics devices.

According to one embodiment of the invention, the device may comprise a second electrically conductive and/or semi-conductive intermediate layer galvanically isolated from the electrically conductive portions providing a capacitive connection to the electrically conductive portion. By forming additional contacts which are galvanically isolated from the electrically conductive portion in the insulating layer, the flow charge carriers may be controlled through a capacitive coupling. Thereby, a three-terminal device such as a transistor may be formed. The second conductive layer forming such contacts may be arranged either at the surface of the insulating layer for controlling the interface between the top contact and the electrically conductive portion. Alternatively, contacts may be integrated within the insulating layer to provide capacitive control of the electrically conductive portion. A contact within an insulating layer may for example be formed by basing the device on an SOI (silicon on insulator) wafer and forming the contacts on the Si layer prior to processing the rest of the device.

In embodiments of the invention, the nanostructures are substantially vertically aligned to the substrate. The nanostructures may have a length ranging from nanometers to centimeters. However, the nanostructures may typically have a length in the nanometer to micrometer range. The desired length of the nanostructures will of course vary with the desired application of the device and so the length of the nanostructures may advantageously be adapted to fit with a desired application of the device.

In embodiments of the invention the nanostructures are multiwall carbon nanotubes arranged in bundles.

BRIEF DESCRIPTION OF THE DRAWINGS

These and other aspects of the present invention will now be described in more detail, with reference to the appended drawings showing exemplary embodiment(s) of the invention, wherein:

FIG. 1 is a flow-chart schematically illustrating a method for manufacturing a device comprising set of nanostructures according to an embodiment of the present invention;

FIGS. 2a-d are enlarged cross-sectional views of the device, where each view corresponds to a stage of the manufacturing process according to the method of FIG. 1;

FIGS. 4a-c show a cross-sectional side view of exemplary embodiments of the device according to the present invention.

DESCRIPTION OF EXAMPLE EMBODIMENTS OF THE PRESENT INVENTION

Figure 3:
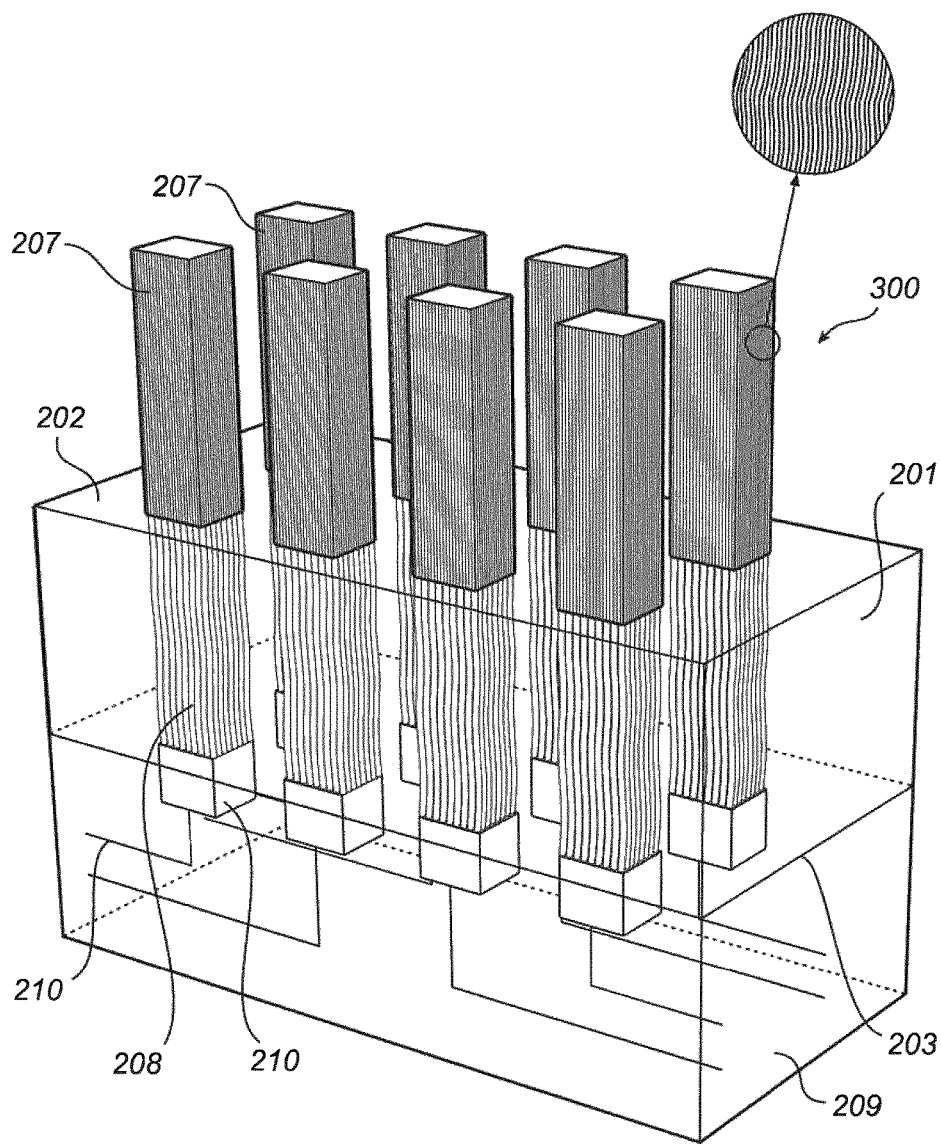
FIG. 3 shows a perspective view of an embodiment of the device according to the invention.

In the following description, the present invention is described with reference to a method for manufacturing of a device comprising a first substrate comprising a plurality of sets of nanostructures arranged on the first substrate, wherein each of the sets of nanostructures is individually electrically controllable.

The present inventor has found a method for growing sets of nanostructures on top of an insulating layer comprising an insulating material and during the same heating cycle forming individually addressable electrical connections to each set of nanostructures within the insulating layer.

An embodiment according to the method of to the invention will now be described in detail with reference to FIG. 1 which schematically illustrates the steps 101-104 according to one embodiment of the inventive method, and FIGS. 2a-d which show the resulting device after each of these steps.

The first step 101 involves providing a first substrate 200 having an insulating layer comprising an insulating material. The insulating material may, for example, be one of $SiO_2$ or $Si_3N_4$. The substrate may be any type of insulating or semiconducting substrate commonly used in semiconductor processing such as Si, SiO2, quartz or the like.

The second step 102 involves providing a plurality of stacks 204 on a first face 202 of the insulating layer. As shown in FIG. 2b the stacks are arranged on the first face 202 such that they are separated from each other. The stacks 204 may typically have a length and/or a width (or diameter) in the range of nanometer to micrometer. Moreover, each stack comprises a first layer 205 comprising a first conductive material arranged in direct contact with the insulating layer 201, and a second layer 206 comprising a second material arranged on the first layer. The first material is typically different from the second material, wherein the second material catalyses the formation of nanostructures.

Examples of second materials having nanostructure catalytic activity include, but are not limited to, Fe, Ni and Co.

In one embodiment of the invention each stack 204 is provided on the first face 202 of the first substrate by first depositing the first layer 205 on the first substrate and subsequently depositing the second layer 206 thereon. Alternatively, in another embodiment of the invention, the second layer 206 is first deposited onto the first layer 205, and subsequently, the resulting stack 204 comprising the first 205 and the second 206 layer is deposited onto the first substrate 201. The pattern of the stacks may for example be defined through photolithography and subsequent etching. Alternatively, a shadow mask may be used while depositing the first and second layer.

The third step 103, involves heating the substrate 200 having the plurality of stacks arranged thereon in an atmosphere such that sets of nano structures 207, as shown in FIG. 2c, are formed on the second layer 206 and such that the first material of the first conductive layer 205 diffuses into the insulating layer 201 and/or reacts with the insulating material of the insulating layer 201 to form an electrically conductive portion 208 within the insulating layer 201 below each of the sets of nanostructures 207, wherein the electrically conductive portions are electrically conductive and/or semi-conductive and comprise a mixture of the first material and the insulating material and/or reaction adducts thereof, thereby each of the electrically conductive portions 208 allows for individual electrical control of a respective one of the set of nanostructures 207.

By separating the stacks 204 from each other on the insulating layer, sets of nanostructures may be achieved thereon, wherein each of the set of nanostructures 207 corresponds to the nanostructures grown on each stack 204.

The electrically conductive portions 208 may thus be electrically conductive and/or semi-conductive due to the presence of a conductive and/or semi-conductive first material which has diffused into the underlying insulating material. In addition, or alternatively, the first material may react with the insulating material to give reaction product(s) which may be electrically conductive and/or semi-conductive, in which case the first material does not need to be electrically conductive and/or semi-conductive in itself in order to achieve the electrically conductive and/or semi-conductive electrically conductive portions.

In an exemplary embodiment, the first material is Al and the insulating material is $SiO_2$, in which case a thermal reaction therebetween typically produces $Al_2O_3$ having insulating properties and Si having semi-conductive properties. Thus, in such case the electrically conductive portions may comprise a mixture of Al, Si, $SiO_2$, $Al_x(SiO_2)_y$, and $Al_2O_3$.

It should, however, be emphasized that it is expected that many other material combinations of a conductive material and an insulating material can provide the desired conductive portions. One of ordinary skill in the art will be able to determine, without undue burden, if such conductive portions have been formed by a process similar to that described under the heading "Example fabrication process".

The electrical properties of the electrically conductive portions can thus easily be configured, for example to fit with a desired application, through the selection of the first conductive material and the insulating material, the thickness of the insulating layer and the thickness of the first layer, diffusion/reaction temperature, and time of heating.

Similarly, the shape of the electrically conductive portions may also be controlled by, for example, adapting the thickness of the first layer 205 and insulating layer 201, and/or diffusion/reaction temperature and time of heating, thus configuring the shape to fit with a given application. For example, according to one embodiment of the invention, as embodied in FIG. 2c, the electrically conductive portions 208 are paths extending from through the insulating layer. Thereby, each electrically conductive portion is directly electrically addressable at the interface 203 between the insulating layer and the substrate. Alternatively, in another embodiment of the invention (not shown in FIG. 2c), the electrically conductive portions may be configured to not extend through the insulating layer such that each electrically conductive portion is electrically isolated from the substrate and thereby enabling a capacitive and/or inductive electrical connection at the interface between the insulating layer and the substrate to the electrically conductive portions.

The invention is not limited to any specific method of growing nanostructures so the composition of the atmosphere in the growth step may therefore depend on the type of nanostructures grown (e.g. carbon nanotube, single or multi-walled, carbon nanofibers, ZnO nano wires, etc). Methods such as chemical vapor deposition, plasma enhanced chemical vapor deposition, arc discharge, laser ablation, or any other suitable methods known to the skilled person, may typically be used. Thus, the atmosphere may typically comprise at least one of ethylene, argon, plasma, hydrogen, nitrogen and ammonia (for carbon nanotube growth).

The nanostructures may advantageously be carbon nanotubes, particularly multi-walled carbon nanotubes arranged in bundles having a length in the nanometer to micrometer range, depending on the desired application.

Advantageously, the first material and/or the insulating material may be chosen such that a diffusion of the first material into the first substrate and/or a reaction between the first material and the insulating material is achievable by heating said first substrate having the stack arranged thereon to within a preferred temperature interval of from 100° C. to 1000° C., preferably between 500° C. and 1000° C., more preferably between 700° C. and 900° C., and most preferably between 750° C. and 800° C. The chosen temperature depends on the growth requirement parameters of the particular nanostructure desired and on the temperature required for achieving the conductive portions for a given material combination.

According to one embodiment of the invention the method further comprises a fourth step 104, which involves providing a second substrate 209 underlying the insulating layer 201, as shown in FIG. 2d, wherein the second substrate 209 comprises a connecting structure 210 configured to provide a first electrical connection to each of the sets of nanostructures 207 via a respective one of the electrically conductive portions 208.

For example, as illustrated in FIG. 2d, the connecting structure may be embodied as a plurality of wells 210 comprising an electrically conductive or semi-conductive material, wherein each well 210 is electrically connectable to a power source or sensing device and thus individually addressable.

Alternatively, in another embodiment of the method according to the invention, the second substrate 209 may be provided at any step prior to the heating step 103, for example in the first step, and thereby the first electrical connection through the connecting structure 210 is achieved immediately upon heating. Moreover, a similar connecting structure may be incorporated in the first substrate.

It should be noted, that in embodiments of the method according to the invention, a second individually addressable electrical connection to each set of nanostructure may be by providing an intermediate layer (not shown in FIGS. 2a-d) comprising an electrically conductive and/or semi-conductive material in between the first and second layer of each stack, which intermediate layer is electrically connectable to a power source, through for example a connecting structure on top of the insulating layer.

FIG. 3 shows a perspective view of an embodiment of the device 300 according to the invention, comprising an insulating layer 201 having a first face 202 and a second face 203, the insulating layer 201 comprising an insulating material. A plurality of sets of nanostructures 207 are comprised on the first face 202 of the substrate, and as shown in FIG. 3 the sets of nanostructures 207 are spaced apart from each other. Further, the insulating layer 201 comprises a plurality of electrically conductive portions 208, each electrically conductive portion 208 underlying a respective one of the sets of nanostructures 207 such that each electrically conductive portion 208 is in electrical connection with a respective one of the sets of nanostructures 207. The electrically conductive portions 208 are electrically conductive and/or semi-conductive.

In embodiments of the device according to the invention, as shown in FIG. 3, the device further comprises a substrate 209 underlying the insulating layer 201, wherein the substrate 209 comprises a connecting structure connectable to a power source or sensing device and configured to provide a first electrical connection to each of the electrically conductive portions 208, and thereby enabling individually addressing of each set of nanostructures 207. The power source include, for example, be a conventional AC or DC power source, a battery, a capacitor system, and the sensing device may, for example, be a multimeter or equivalents (e.g. volt meter or ampere meter), depending on the desired application of the device.

In embodiments of the device, the sets of nanostructures may advantageously be substantially vertically aligned to the substrate.

Typically, the set of nano structures correspond to a length and/or a width (or diameter) in the range of nanometers to micrometers.

In embodiments of the device the sets of nanostructures may comprise multiwall carbon nanotubes arranged in bundles.

FIGS. 4a-c show a cross-sectional side view of embodiments of the device according to the invention. As is illustrated in FIGS. 4a-c, the connecting structure 210 comprises a plurality of wells 210 comprising an electrically conductive and/or semi-conductive material and which wells are electrically connectable to a power source. Thereby, each well provides a first electrical connection to each of the electrically conductive portions 208.

In embodiments of the device 410 according to the invention, as shown in FIG. 4a, the electrically conductive portions may be embodied as paths extending from the first face 202 of the insulating layer to the interface 203 between the insulating layer and the substrate, thereby the first electrical connection is a direct electrical connection between the electrically conductive portions 208 and the connecting structure 210.

In embodiments of the device 411 according to the invention, as shown in FIG. 4b, the electrically conductive portions extend into the insulating layer 201 from the first face 202 thereof to a desirable depth such that the electrically conductive portions are separated from the interface 203 between the insulating layer and the substrate, thereby the first electrical connection to each of the electrically conductive portions 208 corresponds to a capacitive electrical connection.

As is illustrated in FIG. 4c, the device 412 according to the invention may comprise an electrically conductive and/or semi-conductive intermediate layer 402 arranged on the first face 202 of the insulating layer in between each set of nanostructures 207 and the underlying electrically conductive portions 208, and each intermediate layer may be electrically connectable through a connecting structure 403 on the first face 202 of the insulating layer 201, thus providing a second individually addressable electrical connection to each set of nanostructures 207.

In various embodiments of the invention, the conducting path may comprises at least one rectifying junction which may be tailored to exhibit desired characteristics based on the selected materials, thereby enabling fabrication of devices such as solar cells and transistors and super capacitors. For example additional conductive layers may be arranged between the first conductive layer and the insulating layer as long as the material of the first conductive layer may reach the insulating layer to form the electrically conductive portion. The first conductive layer may interact with such an intermediate conductive layer for example by diffusion or through a chemical reaction. Thus, rectifying junctions may be formed in the electrically conductive portion as different materials have different diffusion/reaction properties within the insulating layer. Furthermore, the position of such rectifying junctions may be controlled by selecting the thickness of the layers. By controlling the positions and properties of rectifying junctions in the electrically conductive portions, various devices such as transistors and photovoltaic devices may be formed.

Additionally, variations to the disclosed embodiments can be understood and effected by the skilled person in practicing the claimed invention, from a study of the drawings, the disclosure, and the appended claims. For example, a surface of the insulating layer may be etched and the stacks may be arranged on the etched surface, thus the produced nanostructures may be substantially aligned to the etched surface. Furthermore, the second layer of the stacks which is arranged on the first layer of the stacks may only cover a portion of the first layer.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

Example Fabrication Process

Growth of Conductive Carbon Nanotube Forests:

The device was fabricated using a silicon wafer with 0.5 µm of oxide layer on it. Metal and catalyst (300 nm of aluminum and 1 nm of iron) was patterned using photolithography, metal evaporation, and lift off. The catalyst was annealed at 775° C. for 20 minutes under a flow of 100 sccm of hydrogen and 400 sccm of helium to activate the catalyst material. Immediately after the annealing, while maintaining the same temperature, growth of carbon nanotubes was performed by introducing 100 sccm of ethylene into the quartz tube for 30 minutes, before cooling the sample. The recipe used to grow nanostructures is summarized in Table 1:

TABLE 1

| Step | Time (min) | Hydrogen (sccm) | Ethylene (sccm) | Helium (sccm) | Temp (° C.) |
|---|---|---|---|---|---|
| 1 | 5 | 0 | 0 | 1000 | 25 |
| 2 | 5 | 100 | 0 | 400 | 25 |
| 3 | 10 | 100 | 0 | 400 | 775 |
| 4 | 30 | 100 | 100 | 400 | 775 |
| 5 | 1 | 100 | 100 | 400 | 25 |
| 6 | 15 | 100 | 100 | 400 | 25 |
| 7 | 5 | 0 | 0 | 1000 | 25 | where time is in minutes, gases are in sccm, temperature is in degrees Celsius. When the step temperature is different from the previous step temperature it means the temperature is changed by ramping. For instance, step 3 involves ramping of the temperature from 25° C. to 775° C. over 10 minutes. Furthermore, step 5 is the step where nanostructures are grown. Thus, the growth time is 30 minutes. It has been shown that Al may reduce $SiO_2$ to form an electrically conductive material, see Dadabhai et al., Journal of Applied Physics 80 (11) pp. 6505-6509 (1996), hereby incorporated by reference. As readily understood by the person skilled in the art, the above referenced parameter values may be varied while still being within the scope of the invention. For example, Helium may be replaced by another inert gas such as Ar or N, the temperature ramps may vary, growth temperatures may be varied and so on. In particular, the step where nanostructures are grown, i.e. step 4 in Table 1, may for example comprise:
 200 sccm Ethylene, 80 sccm Hydrogen, 150 sccm Argon at 750° C. for 30 min.
 150 sccm Ethylene, 400 sccm Hydrogen, 200 sccm Argon at 700° C. for 30 min.
 200 sccm Acetylene, 200 sccm Hydrogen, 700° C. for 30 min.

Furthermore, the temperature of steps 3 and four may vary depending on the selected material combinations.

The invention claimed is:

1. A device (300, 410-412) having individually addressable sets of nanostructures (207) comprising:
 a first substrate (200), wherein the first substrate comprises a first face (202) and a second face (203), wherein an insulating layer (201) comprising an insulating material arranged on said first face (202) of said first substrate (200);
 a plurality of electrically conductive portions (208) within said insulating layer (201), said portions being spaced apart from each other;
 a set of nanostructures (207) arranged on said first face (202) of the first substrate, such that the nanostructures are spatially separated and grown on top of the said first face (202), wherein said sets of nanostructures (207) are arranged on each of said electrically conductive portions (208) such that each electrically conductive portion is in electrical connection with a respective one of said sets of nanostructures;
 a connecting structure (210) in a second substrate (209) underlying said second face (203) of said insulating layer (201), wherein the said connecting structure (210) is comprised of materials different than the composition materials of the conductive portions (208), the insulating material and the said second substrate (209), said connecting structure being connectable to an external device and configured to provide a first electrical connection to each of said electrically conductive portions (208), and thereby enabling individual addressing of each set of nano structures (207).

2. The device (300, 410-412) according to claim 1, wherein said connecting structure comprises a plurality of wells (210) comprising a conductive and/or semi-conductive material, wherein said wells are electrically connectable to an external device, wherein each well provides said first electrical connection to each of said electrically conductive portions, and wherein the material of such wells is different from the conductive portion (208) and the insulating material.

3. The device (300, 410-412) according to claim 1, wherein said electrically conductive portions are paths extending from said first face (202) of said first substrate (200) to said second face (203) thereof, wherein said first electrical connection is a direct electrical connection between said electrically conductive portions and said connecting structure (210), and wherein the materials of said electrically conductive portions (208) are different from the connecting structures (210).

4. The device (300, 410-412) according to claim 1, wherein said electrically conductive portions (208) extend into said first substrate (200) from said first face (202) thereof to a desirable depth such that said electrically conductive portion is separated from an interface (203) between said first substrate (200) and said insulating layer (201), thereby said first electrical connection to each of said electrically conductive portions (208) and the connecting structure (210) corresponds to a capacitive and/or an inductive electrical connection.

5. The device (300, 410-412) according to claim 1, wherein said device comprises an electrically conductive and/or semi-conductive intermediate layer (402, 403) in between said sets of nano structures (207) and said electrically conductive portions (208), thus providing a second individually addressable electrical connection to each set of nano structures.

6. The device (300, 410-412) according to claim 1, wherein said device comprises a second electrically conductive and/or semi-conductive intermediate layer galvanically isolated from said electrically conductive portions (208) providing a capacitive connection to said electrically conductive portion.

7. The device (300, 410-412) according to claim 1, wherein said nano structures are substantially vertically aligned to the first substrate (200).

8. The device (300, 410-412) according to claim 1, wherein said insulating material is selected from the group consisting of $SiO_2$ and $Si_3N_4$.

9. The device (300, 410-412) according to claim 1, wherein said conductive material is selected from the group consisting of Al, Au, Pt, Mo, Pd, W, Ni, Co, and Ti.

10. The device (300, 410-412) according to claim 1, wherein said conductive material comprises Al and said insulating material comprises SiO2.

11. The device (300, 410-412) according to claim 1, wherein in the external device is a power source.

12. The device (300, 410-412) according to claim 1, wherein in the external device is a sensing device.

13. The device (300, 410-412) according to claim 2, wherein the conductive portion comprises of a conductive material.

14. The device (300, 410-412) according to claim 2, wherein the conductive portion comprises of a semi-conductive material.

15. The device (300, 410-412) according to claim 2, wherein the conductive portion comprises a combination of materials that form a photovoltaic junction.

16. The device (300, 410-412) according to claim 2, wherein the conductive portion comprises at least one rectifying junction.

* * * * *